United States Patent [19]

Shimizu

[11] Patent Number: 4,596,003
[45] Date of Patent: Jun. 17, 1986

[54] SEMICONDUCTOR MEMORY

[75] Inventor: Hiroshi Shimizu, Ikeda, Japan

[73] Assignee: Mitsubishi Denki Kabushiki Kaisha, Tokyo, Japan

[21] Appl. No.: 580,388

[22] Filed: Feb. 15, 1984

[30] Foreign Application Priority Data

Feb. 24, 1983 [JP] Japan ................................. 58-31188

[51] Int. Cl.⁴ .............................................. G11C 11/40
[52] U.S. Cl. ..................................... 365/189; 365/230
[58] Field of Search ............................. 365/189, 230

[56] References Cited

U.S. PATENT DOCUMENTS 4,542,485 9/1985 Iwahashi ............................. 365/189

Primary Examiner—Terrell W. Fears
Attorney, Agent, or Firm—Birch, Stewart, Kolasch & Birch

[57] ABSTRACT

A semiconductor memory which comprises a memory section including a plurality of memory cell groups, each group including a plurality of memory cells; each of said memory cell groups including a circuitry arrangement in which the memory cells in each column are connected by a bit line, and in which the memory cells in each row are connected by a first word line; each of said first word lines having a second word line mating therewith, said second word line being made of aluminum; each of said memory cell groups including a column decoder for selecting one from said bit lines and a row decoder for selecting one from said second word lines each in accordance with an input address signal; and a group selecting unit including a group selecting decoder and a group selecting circuit, whereby said first and second word lines are connected or disconnected so as to enable the memory operation to be conducted group by group.

8 Claims, 18 Drawing Figures (a)

(b)

(c)

(a)

(b)

(a)

(b)

(c)

(d.)

SEMICONDUCTOR MEMORY

FIELD OF THE INVENTION

The present invention relates to a memory of MOS (metal oxide semiconductor) construction which secures a quick operation and a low electricity consumption.

BACKGROUND OF THE INVENTION

The following description is based on the employment of a CMOS memory so as to characterize the essence of the present invention.

FIG. 1 shows a circuit for a static memory cell of CMOS construction, and FIGS. 2(a), 2(b) and 2(c) respectively show pattern layouts thereof, in which a silicon gate process is employed. In FIG. 1 the reference character Vcc designates a power supply, the reference numeral 20 designates a memory cell. The reference characters $T_1$ and $T_3$ designate P-channel field-effect transistors (hereinafter referred to as FET), and $T_2$ and $T_4$ designate N-channel FETs, the four FETs constituting a flip-flop. $T_5$ and $T_6$ designate N-channel FETs, each constituting a transfer gate. The reference numerals 3 and 4 designate bit lines connected to the sourse or drain of the N-channel FETs $T_5$ and $T_6$, respectively. The reference numeral 5 designates a word line connected to the gates of both the FETs $T_5$ and $T_6$.

A typical example of the known memory cells will be explained with reference to FIGS. 1 and 2:

For a memory cell pattern layouts by a silicon-gate process using single layer wirings, the following requirements must be satisfied:

(1) The ground line providing the reference potential must be made of aluminum; and (2) The bit lines must be made of aluminum; on the contrary, if they are made of diffused polysilicon (polycrystalline silicon), the wiring resistance and the load capacity of memory cell increase, which unfavorably affects the operation and the operating speed.

To satisfy these requirements, the bit lines 3, 4 and ground lines 1, 2 are made of aluminum, and arranged in parallel with each other. The word lines 5a, made of polysilicon, are arranged crosswisely of the ground lines 1, 2 and the bit lines 3, 4.

FIGS. 2(a) to 2(c) show pattern layouts for a known memory cell in the order of processing steps. FIG. 2(a) shows a pattern obtained by diffusing impurities into a main surface of the semiconductor substrate so as to produce a diffused region. FIG. 2(b) shows a pattern which is made by adding gates to the pattern of FIG. 2(a). FIG. 2(c) shows a pattern which is made by adding aluminum wirings and contacts to the pattern of FIG. 2(b).

The memory cell pattern of FIG. 2(c) will be explained in comparison with the memory cell circuit shown in FIG. 1:

The ground lines 1, 2 and the bit lines 3, 4, both made of aluminum, are vertically arranged, and the word line 5a, made of polysilicon, is horizontally arranged. There are provided gates 5, and a P-type diffused region 6, which is produced by diffusing impurities into an N-well region 51 formed on the P-type substrate 50. There are provided further diffused regions of N-type, designated by the reference numeral 7. A contact 6a is provided so as to enable an aluminum wiring 61 to be connected to the substrate 50 (i.e. the N-well region 51) and the surface of the diffused region 6 therethrough, thereby applying the power supply Vcc of the N-well region 51 to the diffused region 6. There are provided further contacts 6b which connect between aluminum wirings 62 and the diffused regions 6. In addition, contacts 7a, 6c, 7c and 7b are provided so as to connect between the aluminum wirings 62 and the diffused regions 7, between the aluminum wirings 62 and the gates 5, between the diffused regions 7 and the ground lines 1, 2, and between the diffused regions 7 and the bit lines 3, 4, respectively.

FIG. 3 shows a semiconductor-memory structure using a conventional memory cells. There is provided a memory section 21 including $(n+1)^2$ pieces of memory cells 20, and for this memory section 21, there are provided an X-address decoder 22 and a Y-address decoder 23. A sense circuit 24 is provided for the memory section 21. The reference numerals $x_O$ to $x_n$ and $y_O$ to $y_n$ designate X- and Y-addresses respectively. Under this arrangement the memory section 21 is addressed by the X-decoder 22 and the Y-decoder 23, and the read/write operation of the memory is carried out through the common sense circuit 24.

Under the conventional structure mentioned above, the following problems are likely to arise in accordance with the increase in the memory capacity:

(1) Because the ground lines 1, 2 and the bit lines 3, 4 are made of aluminum, and arranged parallel with each other, the cell area is enlarged, which results in an enlarged chip size. As a result, the productivity is reduced; and (2) Because the relatively long word lines 5a are made of polysilicon, the wiring resistance and the wiring capacity of the memory cells located remote from the decoders tend to increase, thereby prolonging a signal transfer time accordingly. This unfavourably affects the access speed.

In addition, when the number of the Y-addresses become numerous as shown in FIG. 4, the wiring for data line 14 must be lengthened, which is likely to increase the wiring resistance and the floating capacity to an unnecessary extent. This causes a retarded access speed.

OBJECTS AND SUMMARY OF THE INVENTION

The present invention aims at satisfying the above-mentioned requirements, and has for its object to provide a semiconductor memory capable of reducing electric power consumption.

Another object of the present invention is to provide a semiconductor memory capable of increased operating speed.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to the present invention, there is provided a semiconductor memory, which comprises:

a memory section including a plurality of memory cell groups, each group including a plurality of memory cells;

each of said memory cell groups including a circuitry arrangement in which the memory cells in each column are connected by a bit line, and in which the memory cells in each row are connected by a first word line;

each of said first word lines having a second word line mating therewith, said second word line being made of aluminum;

each of said memory cell groups including a column decoder for selecting one from said bit lines and a row decoder for selecting one from said second word lines each in accordance with an input address signal; and a group selecting unit including a group selecting decoder and group selecting circuits, whereby said first and second word lines are connected or disconnected so as to enable the memory operation to be conducted group by group.

DETAILED DESCRIPTION OF THE INVENTION

Figure 5:
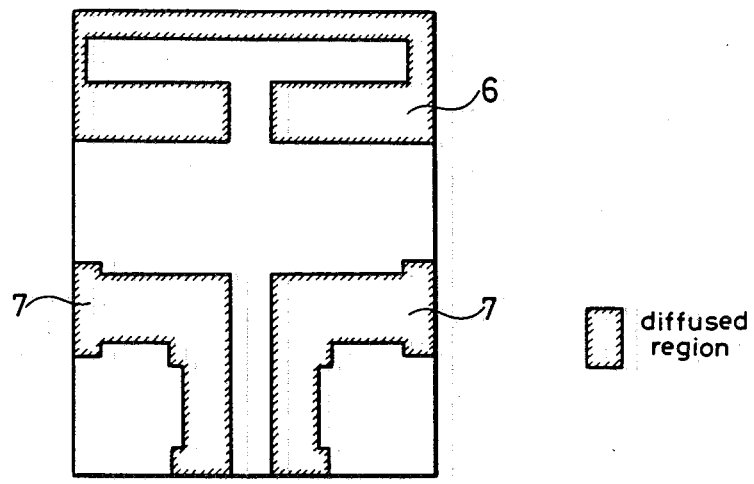
FIGS. 5(a) to 5(d) show patterns of memory cells experimentally thought of in the process of embodying the present invention, represented in the order of two-aluminum-layer processing steps.
Figure 5:
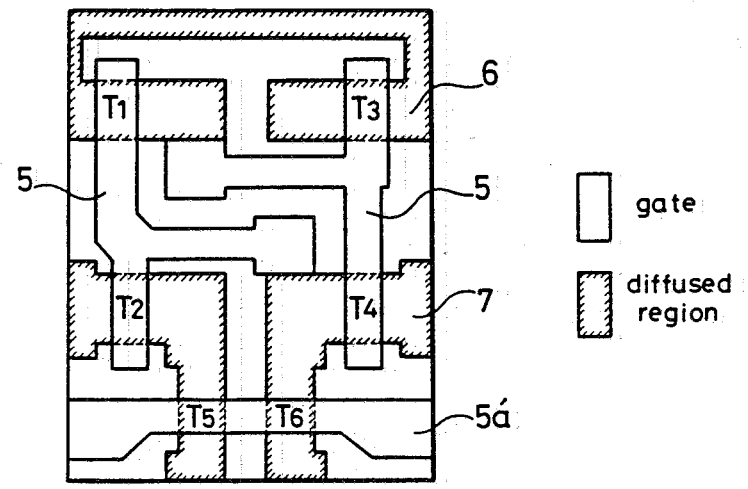
Figure 5:
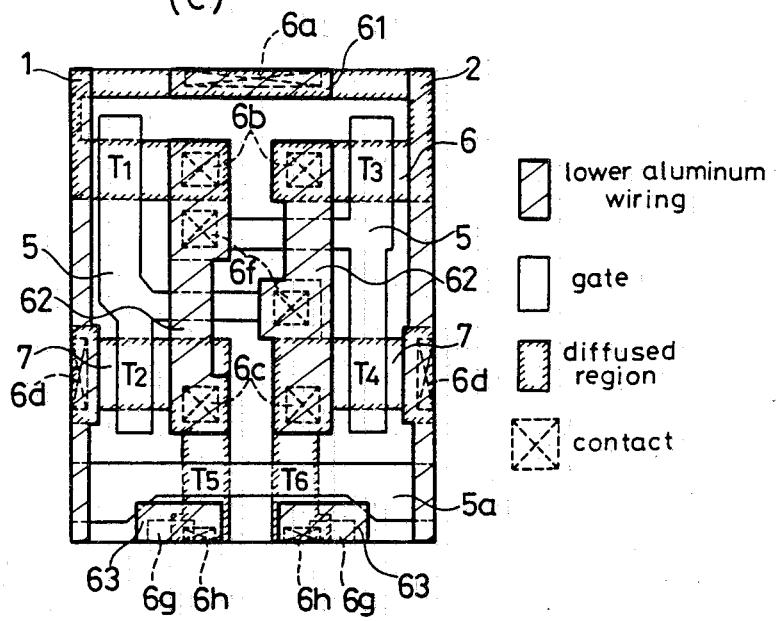
Figure 5:
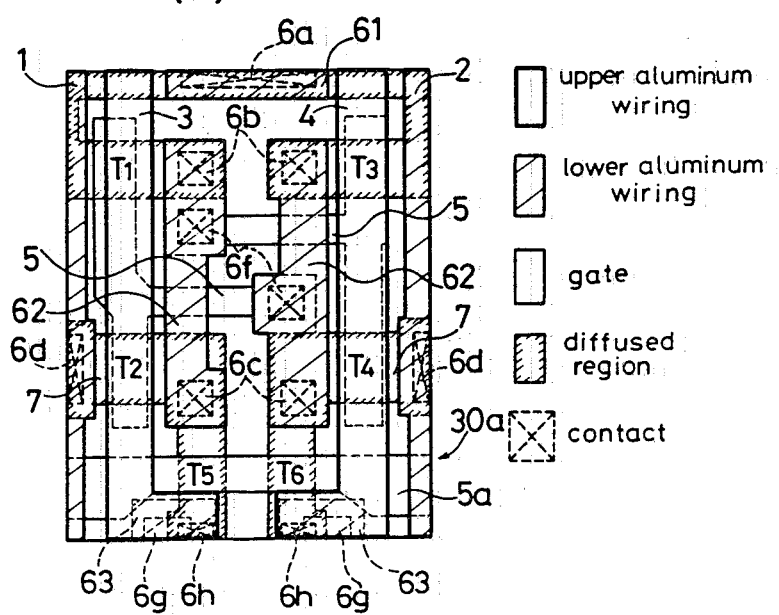

Referring to FIG. 5 a memory cell 30a has a pattern formed by using a two-aluminum-layer process alone. FIG. 5(a) shows a pattern in which diffused regions are formed on a main surface of the semiconductor substrate, FIG. 5(b) shows a pattern formed by adding gates to that of FIG. 5(a), and FIG. 5(c) shows a pattern formed by adding first (lower) aluminum wiring layer and contacts to that of FIG. 5(b). FIG. 5(d) shows a pattern formed by adding second (upper) aluminum wiring layer and contacts to that of FIG. 5(c).

In FIG. 5(d) the pattern of the memory cell 30a is formed by integrating the ground lines 1 and 2 with the first (lower) aluminum layers, and the bit lines 3 and 4 with the second (upper) aluminum layers above the ground lines 1, 2. The reference numeral 6g designates a through-hole for connecting the first aluminum wiring 63 and the bit lines 3, 4 composed of the second aluminum wiring. The reference numeral 6h designates a contact for connecting the first aluminum wiring 63 and the diffused region 7.

Figure 1:
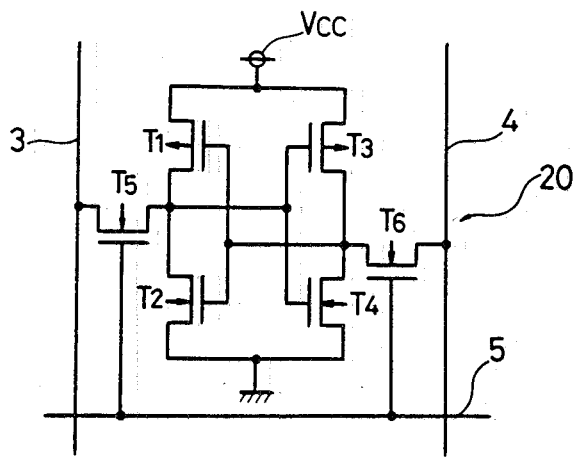
FIG. 1 is a circuit diagram of a memory cell generally known.
Figure 2:
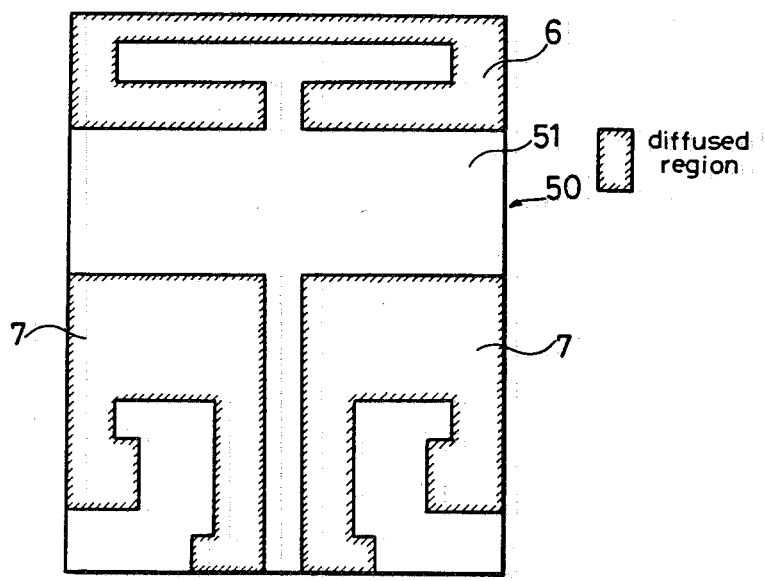
FIGS. 2(a) to 2(c) show patterns of the known memory cells of FIG. 1 in the order of processing steps.
Figure 2:
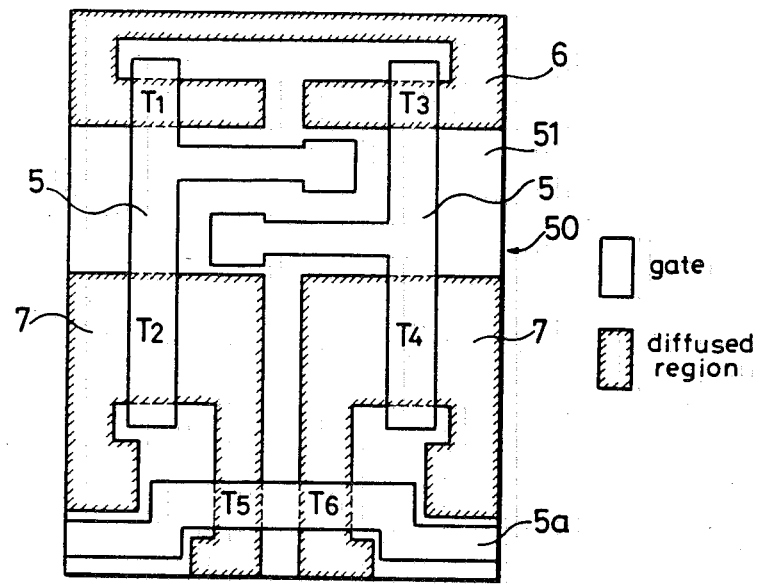
Figure 2:
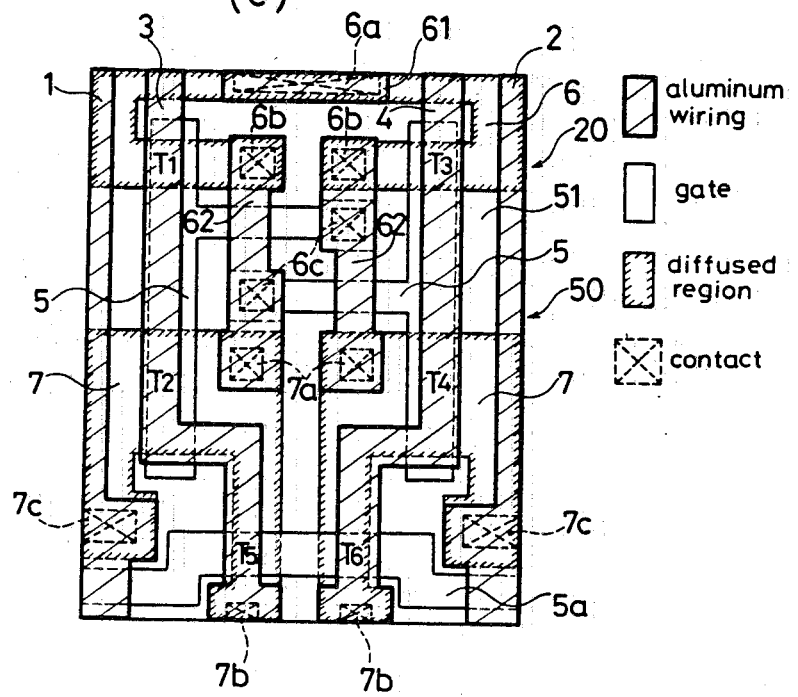

The pattern of the memory cell 30a makes it possible to narrow the intervals between the ground lines 1, 2 and the bit lines 3, 4 in comparison with the memory cell 20 shown in FIG. 2. This restriction of intervals is equal to the deletion of two aluminum wirings, thereby resulting in a reduction in the cell area. However, if this memory cell 30a is employed to constitute a memory section, the prolonged access time will be a problem because of the increased wiring resistance and capacity of the word lines 5a which are made of polysilicon throughout the whole length. The prolonged access time will become more apparent with an increase in the memory capacity.

Figure 6:
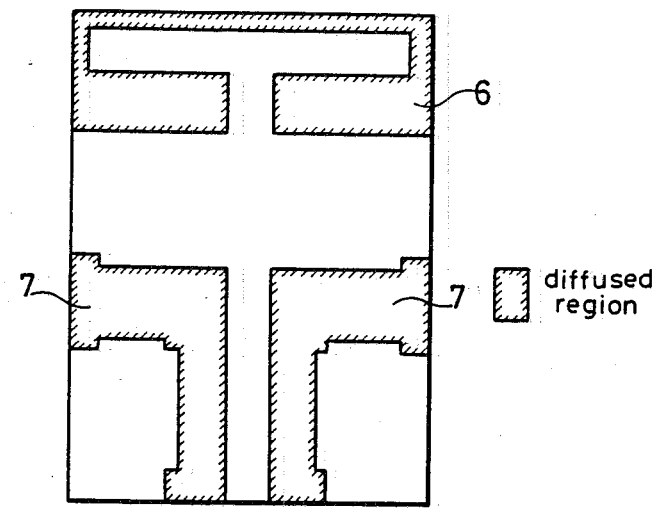
FIGS. 6(a) to 6(d) show patterns of memory cells adapted for use in embodying the present invention, represented in the order of processing steps.
Figure 6:
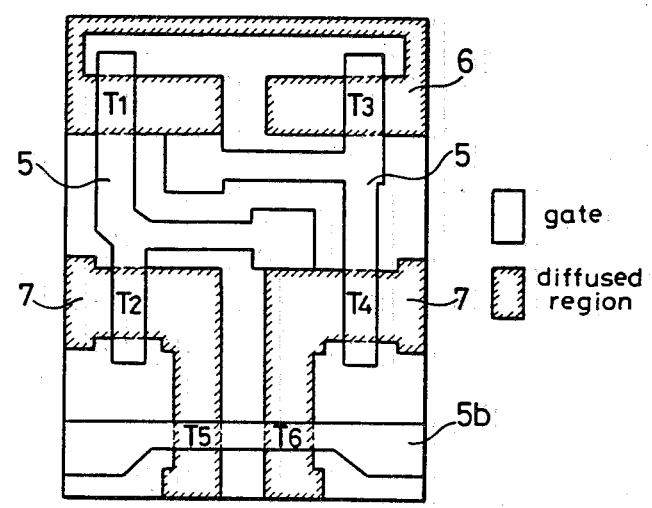
Figure 6:
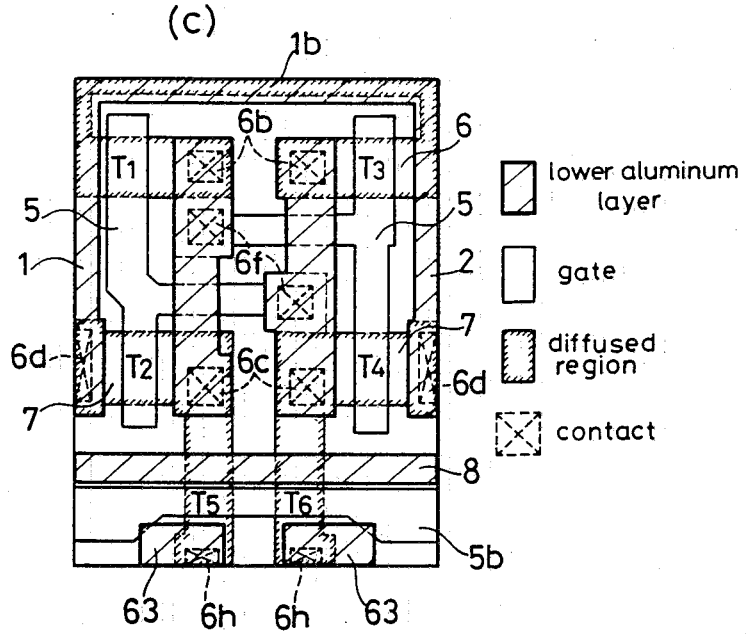
Figure 6:
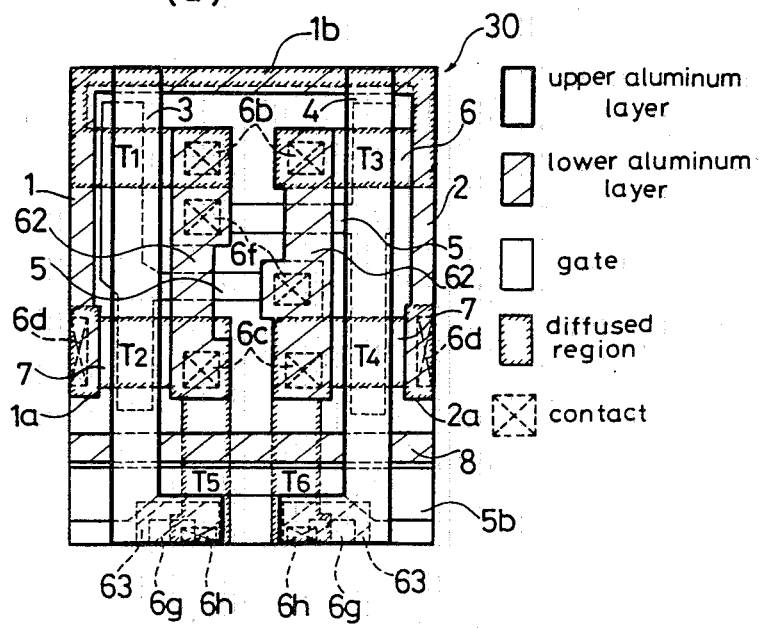

FIG. 6 shows a memory cell 30 which has solved the problem of the prolonged access time mentioned above. FIGS. 6(a) to 6(d) show patterns corresponding to those shown in FIGS. 5(a) to 5(d), respectively.

In the memory cell 30 the ground lines 1 and 2 of aluminum are connected to each other by a connecting line 1b arranged crosswisely of the cell, and additionally, there is provided a second word line 8 (the first aluminum wiring) between the terminating ends 1a, 2a of the ground lines 1, 2 (FIG. 6(d)) and the first word line 5b (made of polysilicon) in parallel with the first word line 5b. The second word line 8 is adapted to allow the output signal from the address decoder to appear thereon. The bit lines 3 and 4 are constituted by the second aluminum wirings. Unlike the memory cell shown in FIG. 5 in which an aluminum wiring 61 for the power supply Vcc and the substrate 50 are contacted with each other through a contact 6a, the memory cell 30 has a unique arrangement in which the power supply Vcc for each memory cell is connected to the diffused region which in turn is contacted with the aluminum wiring at desired points. Regardless of the addition of the second word lines 8, the area of the cell advantageously remains the same as the area of the cell shown in FIG. 5.

Figure 7:
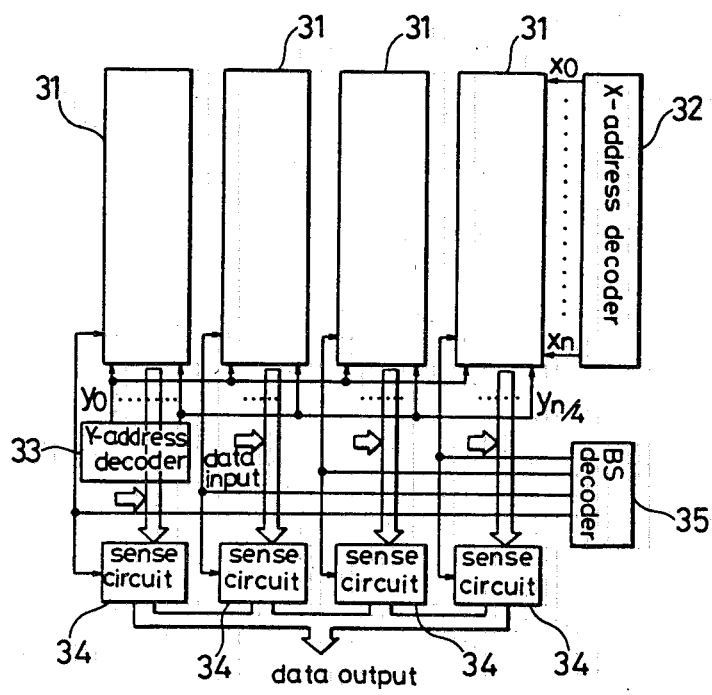
FIG. 7 is a structural view showing an example of the semiconductor memory embodying the present invention.

Referring to FIG. 7, an example of the semiconductor memory embodying the present invention will be described in detail:

One of the features of this embodiment resides in the memory section which is constituted by the memory cells 30 shown in FIG. 6(d). Another feature resides in the structure in which the memory section is divided into a plurality of memory cell groups or blocks, this construction being generally known as a block selecting system. In the illustrated embodiment the memory section is divided into four memory cell groups; hereinafter each group will be referred to as the block 31.

Each block 31 has $(n+1)^2/4$ memory cells 30, each of which has a matrix of $(n+1)$ rows and $(n+1)/4$ columns. The memory cells 30 located in each column in each block 31 are connected by a pair of bit lines. The reference numeral 33 designates a column decoder or Y-decoder whereby a pair of bit lines are selected in accordance with the input address signal.

Figure 3:
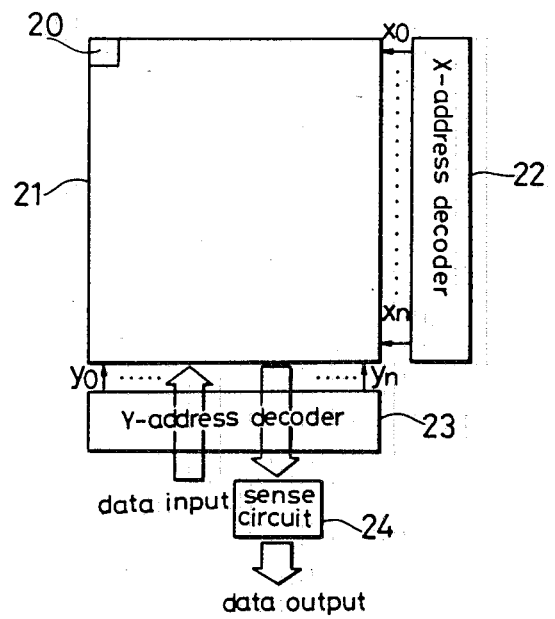
FIG. 3 is a structural view of the memory cell of FIG. 1.

Unlike the conventional memory devices as shown in FIG. 3, the block selecting system mentioned above has an arrangement in which the Y-direction decoder for the memory section consists of Y-decoders 33 and a block selecting decoder 35, and in which a sense circuit 34 is provided for each block 31. An input Y-address signal is divided into 2 bits for the block selecting decoder 35 and remaining bits for the Y-decoder 33, and then input thereto each.

Figure 8:
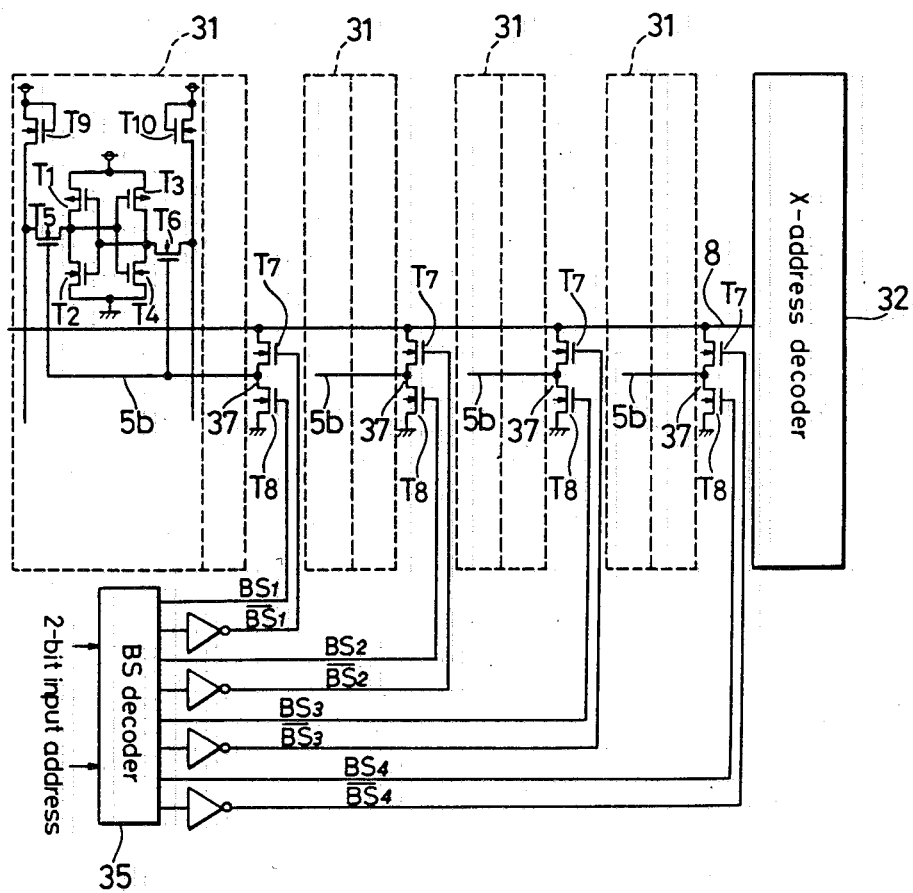
FIG. 8 shows an example of the circuit diagram for performing the block selection.

Referring to FIG. 8, a circuit for performing the block selection referred to above will be described:

There are provided $(n+1) \times 4$ first word lines $5b$, that is, $(n+1)$ word lines for each block 31. As described above, each word line $5b$ is connected to all the memory cells 30 in each row of each block 31, wherein the word line is made of polysilicon.

In addition to the first word lines $5b$, there are provided $(n+1)$ second word lines 8 for the $(n+1)$ rows in common through all blocks 31, wherein the second word lines 8 are integrated with the first (lower) aluminum layer. The reference numeral 32 designates an X-decoder or row decoder for selecting a particular one from the second word lines 8 in accordance with the input address signal. In addition, there is provided a group or block selecting circuit 37 between the paired first and second word lines $5b$, 8, so as to effect the connection and disconnection therebetween. There are $(n+1)$ pieces of block selecting circuits 37 provided for each block 31, and therefore, the total number of pieces amounts to $(n+1) \times 4$. The block selecting circuit 37 comprises two N-channel FETs $T_7$, $T_8$ which are connected in series between the second word line 8 and the ground. The FETs $T_7$ in the side of the second word line 8 receives, at its gate, the inverted signal ($\overline{BS}$) of a block selecting signal BS which is obtained by decoding the 2-bit address signal by the block selecting decoder 35. The FET $T_8$ in the side of the ground receives, at its gate, the above-mentioned block selecting signal BS. The wirings for these signals BS and $\overline{BS}$ are integrated with the upper aluminum layer. The first word line $5b$ is connected to the connecting node and the first word line $5b$ is connected to the transfer gate of each memory cell 30. The block selecting decoder 35 is designed to select a particular one from the four blocks 31 in accordance with the 2-bit input address signal.

Referring to FIG. 8, how to determine an address (X-address) by the block selecting operation by the circuit shown therein will be described:

When it is presumed that the output of the X-decoder 32 for the row to be selected is in the "H" level, and that the logic circuit of the block selecting decoder 35 is constructed such that the decoder output $\overline{BS}$ and BS for the block 31 to be selected is in the "H" and "L" level respectively, the "H" level is transmitted to the transfer gates $T_5$, $T_6$ of the memory cell 30 in the row to be selected in the block 31 to be selected. On the other hand, the transfer gates $T_5$, $T_6$ of the memory cell 30 in the block 31 kept unselected remains on the ground level and waiting for the subsequent instruction. In this way a particular memory cell in the whole of four blocks 31 is selected, but the read/write operation of memory is performed only in a selected block 31.

Figure 9:
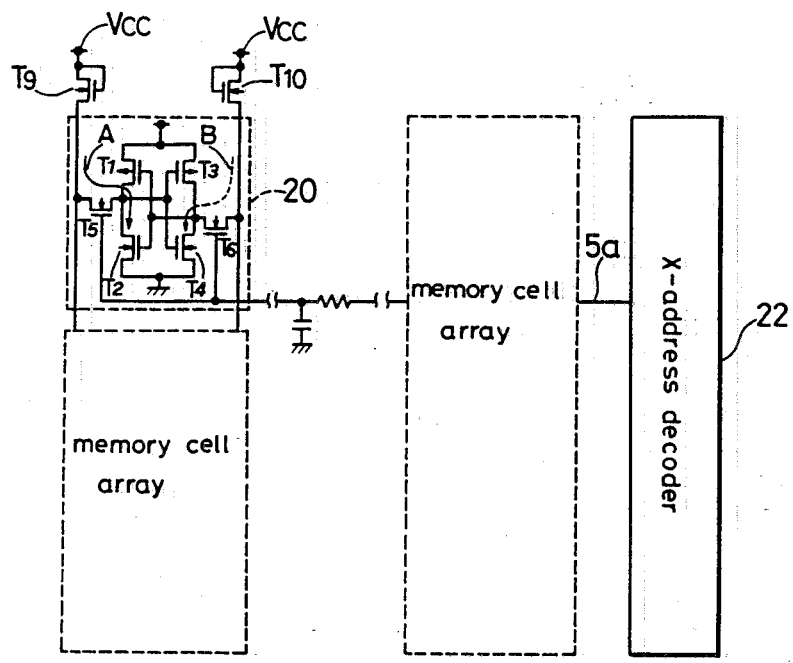
FIG. 9 is a structural view of a generally known memory cell.

Referring to FIG. 9, the characteristic of the block selection described above will be described in greater detail.

In general, the bit line in an array of memory cells is provided with pull-up transisters $T_9$, $T_{10}$ for pulling up the potential thereof up to the power supply Vcc. When selected, the memory cell 20 allows dc currents to flow in the paths indicated by the arrows A and B in FIG. 9. If this happens under the conventional system, these dc currents would flow through the word line $5a$ of all the memory cells in the row which has been selected by the X-decoder 22. In contrast, under the block selecting system of the present invention the current flows only through the first word line $5b$ of the memory cells in the row only in the block 31 which has been selected. No current flows through other memory cells in the blocks 31 which remain unselected. As a result, there is a $\frac{1}{4}$ reduction in electric power consumption.

Figure 4:
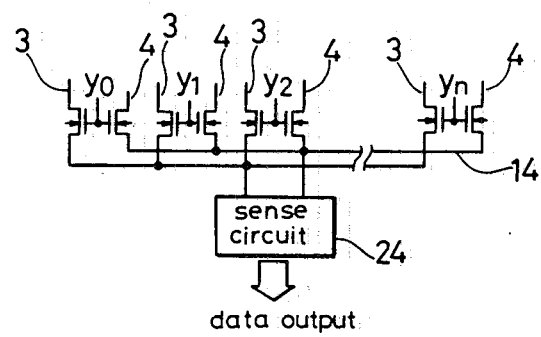
FIG. 4 is a circuit diagram showing the peripheral circuit of the data line incorporated in the memory cell of FIG. 1.

In addition, as far as the connection up to the sense circuit 24 is concerned, the wiring of the data line 14 is lengthened with an increase in the number of Y-address inputs as shown in FIG. 4 under the conventional system. This results in increased wiring resistance and capacity, thereby causing a retarded signal transfer time and accordingly, resulting in a retarded access time. However, under the system of the present invention the sense circuit 34 is provided at each block 31, whereby the number of Y-address input signals can be $(n+1)/4$, that is, is reduced by one-fourth in comparison with that under the conventional system. In addition, the length of the wiring of the data line is shortened by one-fourth. This equally leads to increased access speed.

As evident from the foregoing description, the semiconductor memory of the invention has a memory section constructed with the memory cells 30 shown in FIG. 6($d$), and has an arrangement in which the second word lines 8 connected to the X-decoder are made of the first aluminum layer. As a result, a retardation in transferring signals caused by the wiring resistance and capacity is kept to a negligible extent. In this case, the BS (block selecting) signal lines cross with the word lines 8 on the pattern, but as the BS lines are integrated with the second (upper) aluminum layer, the level crossing of these lines does not occur. This arrangement is also effective to minimize a possible retardation in the signal transfer time. In addition, the lengths of the data lines are shortened by providing each block 31 with the sense circuit 34, thereby shortening the access time. This leads to a reduction in the consumption of electric power and an increase in the operating speed.

As described above, the ground lines 1 and 2 are formed by the first (lower) aluminum layer, and the bit lines 3 and 4 are formed by the second (upper) aluminum layer, and the power supply Vcc for each memory cell is connected to the diffused region, which in turn is contacted with the aluminum wiring at the desired points. As a result, the area of each memory cell is minimized, thereby resulting in a memory of compact size.

Figure 10:
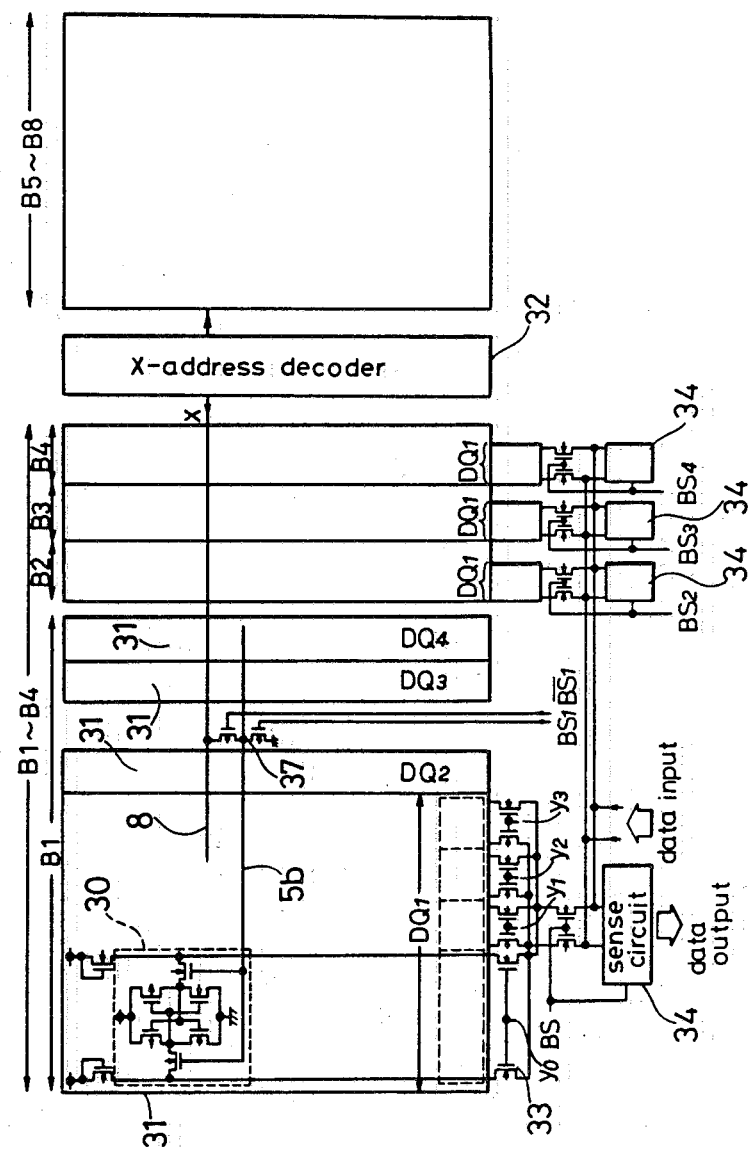
FIG. 10 is a circuit diagram showing an example of the applications in which the memory of FIG. 7 is employed.

Referring to FIG. 10, an example of an application in which the memory of the invention is advantageously incorporated will be described.

The illustrated example is a memory which has an output of eight bits (corresponding to memory sections $B_1$ to $B_8$), and four Y-addresses ($y_0$ to $y_3$). The reference numerals 30 to 34, 8 and $5b$ designate the same elements as those referred to above. Each memory section $B_1$ to $B_8$ comprises four groups or blocks 31 in the same manner as mentioned above. There are four sense circuits for each memory section, with a total of thirty-two sense circuits. One block selecting circuit 37 is provided for each row of each memory section, and one BS decoder (not shown) is provided for each memory section amounting to a total of eight BS decoders.

In addition, the illustrated example has a unique arrangemnt in which BS signal lines ($BS_1$ and $\overline{BS_1}$ to $BS_4$ and $\overline{BS_4}$) are located in the center of the four outputs of the four blocks 31, that is, the four memory cell groups $DQ_1$ to $DQ_4$ in each memory section. This arrangement is designed to minimize the length of the wiring $5b$ of polysilicon which is eventually connected to the transfer gates of the memory cells 30, so as to enhance the characteristic of the memory.

In this example a two-aluminum-layer process is adopted, and a dividing word line circuitry system is equally employed. As a result, the BS signal lines can be integrated with the second aluminum layer. This eliminates the necessity of making the BS (block selecting) signal lines of aluminum in the same manner as the second word lines are, which is essential for avoiding a possible reduction of the signal transfer time. In this respect the memory of the present invention has advantages over the conventional semiconductor memory.

The foregoing description has been given with respect to the CMOS circuit, where it is essential to save the electric power, but of course MOS circuits can be used with the same effects.

What is claimed is:

1. A semiconductor memory comprising:
    l pieces of memory cell groups each of which has a matrix of memory cells arrayed in m rows and $n_j$ columns (j=1 ... l; l is an integer more than or equal to 2);
    a plurality of bit lines each of which is connected to all said memory cells in each column in each of said memory cell groups;
    a column decoder for selecting a particular bit line from said bit lines in accordance with an input address signal;
    (m×l) first word lines each of which is connected to all said memory cells in each row in each of said memory cell groups;
    m pieces of second word lines of aluminum provided for each of the m rows in common through all of said memory cell groups;
    a row decoder for selecting a particular word line from said m second word lines in accordance with an input address signal;
    (m×l) group selecting circuits provided between said paired first and second word lines, whereby said first and second word lines are connected and disconnected;
    a group selecting decoder for selecting one from said memory cell groups so as to effect m group selecting circuits for the selected memory cell group including a memory cell corresponding to the input address signal.

2. A semiconductor memory as defined in claim 1, wherein said bit lines are integrated with an upper aluminum layer, and wherein said second word lines are integrated with a lower aluminum layer.

3. A semiconductor memory as defined in claim 2, wherein said first word line is made of polysilicon layer.

4. A semiconductor memory as defined in claim 1, further comprising a plurality of sense circuits for each of said memory cell groups, whereby an output is drawn from each of said memory cell groups.

5. A semiconductor memory as defined in claim 1, wherein said group selecting circuit is constructed with two field-effect transistors (FET) serially connected to said second word line and the ground, and wherein said first word line is connected to the connecting node of said two FETs, and a true level and a compliment level from said group selecting decoder are respectively applied to the gates of said two FETs.

6. A semiconductor memory as defined in claim 1, wherein said memory cell comprises a first FET connected between a first potential line and a first node and having its gate connected to a second node, a second FET connected between said first node and a second potential line and having its gate connected to said second node, a third FET connected between said first potential line and said second node and having its gate connected to said first node, a fourth FET connected between said second node and said second potential line and having its gate connected to said first node, a fifth FET connected between one of paired said bit lines and said first node and having its gate connected to said first word line, and a sixth FET connected between the other of said paired bit lines and said second node and having its gate connected to said first word line, thereby allowing complimentary signals of said true and compliment levels to appear at said first and second nodes.

7. A semiconductor memory as defined in claim 6, wherein said second potential line and one terminals of said second and fourth FETs are connected to each other through a ground line integrated with a lower aluminum layer, said ground line being arranged in the first, second, and third leg of four legs surrounding said first to sixth FETs, said second word line being integrated with said lower aluminum layer insulated from said ground line, and having a part thereof arranged at a position corresponding to the fourth leg of said four legs inside said first word line connected to the gates of said fifth and sixth FETs, said paired bit lines being integrated with an upper aluminum layer formed on said lower aluminum layer, and being located in parallel with as well as inside said ground lines along said first and second leg.

8. A semiconductor memory as defined in claim 7, wherein said first word lines are made of polysilicon layer.

* * * * *